(12) United States Patent
Kurokawa

(10) Patent No.: US 8,970,253 B2
(45) Date of Patent: Mar. 3, 2015

(54) PROGRAMMABLE LOGIC DEVICE AND SEMICONDUCTOR DEVICE

(71) Applicant: Semiconductor Energy Laboratory Co., Ltd., Atsugi-Shi, Kanagawa-Ken (JP)

(72) Inventor: Yoshiyuki Kurokawa, Kanagawa (JP)

(73) Assignee: Semiconductor Energy Laboratory Co., Ltd., Atsugi-shi, Kawagawa-ken (JP)

( * ) Notice: Subject to any disclaimer, the term of this patent is extended or adjusted under 35 U.S.C. 154(b) by 0 days.

(21) Appl. No.: 14/219,124

(22) Filed: Mar. 19, 2014

(65) Prior Publication Data
US 2014/0285235 A1 Sep. 25, 2014

(30) Foreign Application Priority Data

Mar. 25, 2013 (JP) ................................. 2013-061256

(51) Int. Cl.
*H03K 19/00* (2006.01)

(52) U.S. Cl.
CPC .................................. *H03K 19/0013* (2013.01)
USPC .............................................. 326/44; 326/38

(58) Field of Classification Search
None
See application file for complete search history.

(56) References Cited

U.S. PATENT DOCUMENTS

| 4,829,203 | A | * | 5/1989 | Ashmore, Jr. | 365/185.1 |
|---|---|---|---|---|---|
| 4,906,870 | A | * | 3/1990 | Gongwer | 326/45 |
| 5,313,119 | A | * | 5/1994 | Cooke et al. | 326/41 |
| 5,394,103 | A | * | 2/1995 | Cooke et al. | 326/38 |
| 5,534,793 | A | * | 7/1996 | Nasserbakht | 326/44 |
| 5,640,344 | A | * | 6/1997 | Pani et al. | 365/182 |
| 5,835,998 | A | * | 11/1998 | Pedersen | 326/40 |
| 5,852,365 | A | * | 12/1998 | Tamba et al. | 326/49 |
| 6,157,213 | A | * | 12/2000 | Voogel | 326/41 |
| 6,172,521 | B1 | | 1/2001 | Motomura | |
| 6,501,296 | B2 | * | 12/2002 | Wittig et al. | 326/39 |
| 7,463,059 | B2 | * | 12/2008 | Madurawe | 326/38 |
| 8,669,778 | B1 | * | 3/2014 | Or-Bach et al. | 326/37 |
| 2001/0043082 | A1 | * | 11/2001 | Wittig et al. | 326/39 |
| 2006/0152248 | A1 | * | 7/2006 | Madurawe | 326/41 |
| 2006/0179417 | A1 | * | 8/2006 | Madurawe | 716/17 |
| 2007/0072439 | A1 | | 3/2007 | Akimoto et al. | |
| 2008/0150579 | A1 | * | 6/2008 | Madurawe | 326/38 |
| 2010/0231292 | A1 | * | 9/2010 | Shau | 327/541 |
| 2012/0306533 | A1 | * | 12/2012 | Ohmaru | 326/41 |
| 2013/0285697 | A1 | | 10/2013 | Kurokawa | |
| 2013/0293263 | A1 | | 11/2013 | Kurokawa | |

(Continued)

FOREIGN PATENT DOCUMENTS

JP 10-285014 A 10/1998

*Primary Examiner* — Crystal L Hammond
(74) *Attorney, Agent, or Firm* — Fish & Richardson P.C.

(57) ABSTRACT

A programmable logic device that includes a storage device having smaller area and lower power consumption is provided. The programmable logic device includes a logic block including a storage device. The storage device includes a plurality of groups each including at least a first switch, a transistor that is turned on or off in accordance with a signal including configuration data input to a gate of the transistor through the first switch, and a second switch controlling the electrical connection between a first wiring and a second wiring together with the transistor when the second switch is turned on or off in accordance with the potential of the first wiring. In the logic block, the relationship between the logic level of a signal input and the logic level of a signal output is determined in accordance with the potential of the second wiring.

12 Claims, 13 Drawing Sheets

(56) References Cited

U.S. PATENT DOCUMENTS

| | | |
|---|---|---|
| 2013/0314124 A1 | 11/2013 | Ikeda et al. |
| 2013/0321025 A1 | 12/2013 | Kurokawa et al. |
| 2014/0103958 A1 | 4/2014 | Ikeda et al. |
| 2014/0159771 A1 | 6/2014 | Ikeda et al. |
| 2014/0176185 A1 | 6/2014 | Kurokawa |

* cited by examiner

PROGRAMMABLE LOGIC DEVICE AND SEMICONDUCTOR DEVICE

BACKGROUND OF THE INVENTION

1. Field of the Invention

One embodiment of the present invention relates to a semiconductor device. For example, one embodiment of the present invention relates to a programmable logic device in which the structure of hardware can be changed and a semiconductor device including the programmable logic device.

2. Description of the Related Art

In a programmable logic device (PLD), a logic circuit is formed using adequate-scale programmable logic blocks (PLE), and the functions of the logic blocks and the connection between the logic blocks can be changed after manufacture. Specifically, the PLD includes a plurality of logic blocks and a routing resource for controlling the connection between the logic blocks. The functions of the logic blocks and the connection between the logic blocks formed using a routing resource are defined by configuration data, and the configuration data is stored in a register included in each logic block or a register included in the routing resource. A register for storing configuration data is hereinafter referred to as a configuration memory.

A PLD in which a logic circuit can be reconfigured during operation (this process is called dynamic reconfiguration) has an advantage of high area efficiency over a normal PLD. A multi-context method achieves dynamic reconfiguration by storing a plurality of groups of configuration data in a configuration memory. Compared with a configuration data transferring method that achieves dynamic reconfiguration by transferring configuration data from a memory element to a configuration memory in each group, the multi-context method can reconfigure a logic circuit at high speed.

Patent Document 1 discloses a programmable LSI in which a dynamic random access memory (DRAM) is used as a memory element and a static random access memory (SRAM) is used as a configuration memory.

REFERENCE

Patent Document 1: Japanese Published Patent Application No. 10-285014

SUMMARY OF THE INVENTION

In the case where a DRAM is used as a storage device such as a configuration memory or a memory element in a multi-context PLD, it is difficult to reduce the power consumption of the storage device because the DRAM needs refresh operation. In the case where an SRAM is used as the storage device, the SRAM tends to have high power consumption because of leakage current. The SRAM has a large number of elements per memory cell; thus, it is difficult to make the area of the storage device small.

In view of the technical background, an object of one embodiment of the present invention is to provide a programmable logic device in which the area of a storage device can be small. Alternatively, an object of one embodiment of the present invention is to provide a programmable logic device in which the power consumption of a storage device can be low.

An object of one embodiment of the present invention is to provide a semiconductor device that can be downsized using the programmable logic device. Alternatively, an object of one embodiment of the present invention is to provide a semiconductor device that can consume less power.

A programmable logic device according to one embodiment of the present invention includes a plurality of groups each including at least a first switch, a transistor that is turned on or off in accordance with a signal including configuration data input to a gate of the transistor through the first switch, and a second switch controlling the electrical connection between a first wiring and a second wiring together with the transistor when the second switch is turned on or off in accordance with the potential of the first wiring.

In the programmable logic device according to one embodiment of the present invention with the above structure, when the second switch is turned on in one of the plurality of groups, whether the potential of the first wiring is supplied to the second wiring is determined by the configuration data input to the gate of the transistor.

Furthermore, in one embodiment of the present invention, the off-state current of a transistor used as the first switch is extremely low. With such a structure, a gate of the transistor becomes floating, i.e., has extremely high insulating properties with another electrode or a wiring when the first switch is off. Thus, the potential of the signal is held in the gate of the transistor, so that the on state or off state of the transistor that is determined by the configuration data is also held.

A transistor including a channel formation region in a film of a semiconductor having a wider band gap and lower intrinsic carrier density than silicon can have significantly lower off-state current than a transistor including a channel formation region in a normal semiconductor such as silicon or germanium, and thus is suitable for the first switch. Examples of a semiconductor having a wider band gap and lower intrinsic carrier density than silicon are an oxide semiconductor, silicon carbide, and gallium nitride whose band gap is 2 or more times that of silicon.

In the programmable logic device according to one embodiment of the present invention, the number of elements in each group is smaller than that of an SRAM. Consequently, the area of a storage device for storing configuration data can be small. Since the off-state current of the first switch is lower than that of a transistor including a channel formation region in a silicon film, the data retention time of the first switch can be longer than that of a DRAM. Thus, data can be rewritten less frequently, so that power consumption can be low.

Alternatively, specifically, a programmable logic device according to one embodiment of the present invention includes a logic block including a storage device. The storage device includes a plurality of groups each including at least a first switch, a transistor that is turned on or off in accordance with a signal including configuration data input to a gate of the transistor through the first switch, and a second switch controlling the electrical connection between a first wiring and a second wiring together with the transistor when the second switch is turned on or off in accordance with the potential of the first wiring. In the logic block, the relationship between the logic level of a signal input and the logic level of a signal output is determined in accordance with the potential of the second wiring.

Alternatively, specifically, a programmable logic device according to one embodiment of the present invention includes a storage device and a plurality of logic blocks. The storage device includes a plurality of groups each including at least a first switch, a transistor that is turned on or off in accordance with a signal including configuration data input to a gate of the transistor through the first switch, and a second switch controlling electrical the connection between a first wiring and a second wiring together with the transistor when the second switch is turned on or off in accordance with the potential of the first wiring. The electrical connection between the plurality of logic blocks is determined in accordance with the potential of the second wiring.

One embodiment of the present invention can provide a programmable logic device in which the area of a storage device can be small. Alternatively, one embodiment of the present invention can provide a programmable logic device in which the power consumption of a storage device can be low.

One embodiment of the present invention can provide a semiconductor device that can be downsized using the programmable logic device. Alternatively, one embodiment of the present invention can provide a semiconductor device that can consume less power using the programmable logic device.

DETAILED DESCRIPTION OF THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that a programmable logic device according to one embodiment of the present invention includes, in its category, a variety of semiconductor integrated circuits formed using semiconductor elements, such as microprocessors, image processing circuits, controllers for semiconductor display devices, digital signal processors (DSP), microcontrollers, control circuits for batteries such as secondary batteries, and protection circuits. The semiconductor device according to one embodiment of the present invention includes, in its category, a variety of devices such as RF tags formed using any of the semiconductor integrated circuits and semiconductor display devices. The semiconductor display device includes, in its category, liquid crystal display devices, light-emitting devices in which a light-emitting element typified by an organic light-emitting element is provided in each pixel, electronic paper, digital micromirror devices (DMD), plasma display panels (PDP), field emission displays (FED), and other semiconductor display devices in which semiconductor elements are included in driver circuits.

<Structure Example of Storage Device>

Figure 1:
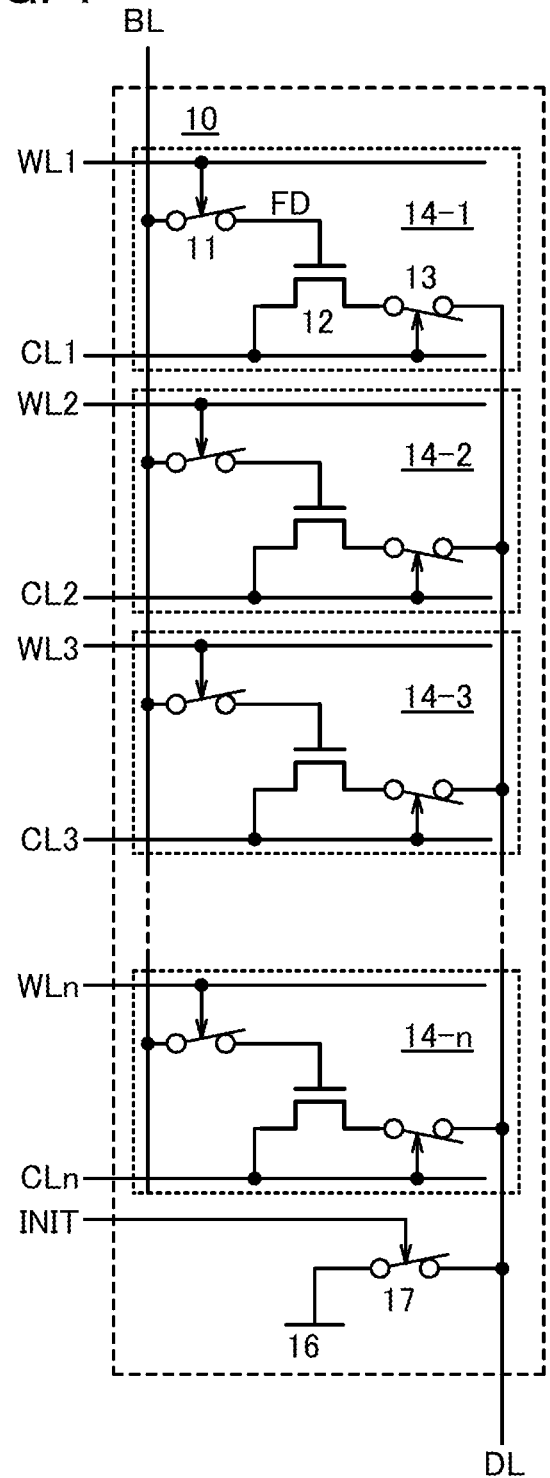
FIG. 1 illustrates a storage device structure.

First, a structure example of a storage device is described. FIG. 1 illustrates the structure of a storage device 10 according to one embodiment of the present invention. The storage device 10 includes a plurality of groups each including at least a switch 11, a transistor 12, and a switch 13. In FIG. 1, each group is illustrated as a cell 14. FIG. 1 illustrates an example in which the storage device 10 includes a plurality of cells 14 (cells 14-1 to 14-n, where n is a natural number of 2 or more).

The switch 11 has a function of controlling input of a signal including configuration data to a gate (a node FD) of a transistor 12. Specifically, when the switch 11 is conducting (on), a signal including configuration data input to a wiring BL is input to the node FD through the switch 11. When the switch 11 is non-conducting (off), the signal input to the node FD is held.

The switch 11 is turned on or off in accordance with the potential of the wiring WL. FIG. 1 illustrates an example in which the switches 11 in the cells 14-1 to 14-n are turned on or off in accordance with potentials input to a plurality of wirings WL (wirings WL1 to WLn), respectively.

The on state or off state of the transistor 12 is determined in accordance with a signal including configuration data input to the node FD.

Furthermore, the switch 13 is turned on or off in accordance with the potential of a wiring CL. FIG. 1 illustrates an example in which the switches 13 in the cells 14-1 to 14-n are turned on or off in accordance with potentials input to a plurality of wirings CL (wirings CL1 to CLn), respectively. The switch 13 has a function of controlling the electrical connection between the wiring CL and a wiring DL together with the transistor 12 when the switch 13 is turned on or off in accordance with the potential of the wiring CL.

Thus, when the switch 13 is on, whether the transistor 12 is on or off is reflected in the electrical connection between the wiring CL and the wiring DL. In other words, the electrical connection between the wiring CL and the wiring DL is determined in accordance with configuration data input to the node FD. Specifically, when the switch 13 and the transistor 12 are on, the wiring CL and the wiring DL are electrically connected to each other, and the potential of the wiring CL is input to the wiring DL. In addition, when the switch 13 is on and the transistor 12 is off, the wiring CL and the wiring DL are electrically isolated from each other, and the potential of the wiring CL is not input to the wiring DL.

Note that in this specification, the term "connection" means an electrical connection and corresponds to a state where current, voltage, or a potential can be supplied or transmitted. Accordingly, a connection state does not always mean a direct connection state but includes an electrical connection state through a circuit element such as a wiring, a resistor, a diode, or a transistor so that current, voltage, or a potential can be supplied or transmitted.

On the other hand, when the switch 13 is off, the wiring CL and the wiring DL are electrically isolated from each other regardless of whether the transistor 12 is on or off.

In FIG. 1, signals including pieces of configuration data can be held in the nodes FD in the cells 14-1 to 14-n. By turning on the switch 13 in any one of the cells 14-1 to 14-n, a piece of configuration data is selected from the pieces of configuration data, and the electrical connection between the wiring CL and the wiring DL can be determined in accordance with the selected configuration data.

In the PLD according to one embodiment of the present invention, a wiring 16 to which a predetermined potential is input and a switch 17 controlling the electrical connection between the wiring 16 and the wiring DL are provided in the storage device 10. The switch 17 is turned on or off in accordance with a signal INIT. When the switch 17 is on, the wiring 16 and the wiring DL are electrically connected to each other, and the wiring DL is initialized to the predetermined potential. Furthermore, when the switch 17 is off, the potential of the wiring 16 is not input to the wiring DL.

If the wiring CL and the wiring DL are electrically connected to each other in accordance with selected configuration data after the potential of the wiring DL is initialized by turning on the switch 17, the potential of the wiring CL is input to the wiring DL. On the other hand, if the wiring CL and the wiring DL are electrically isolated from each other in accordance with selected configuration data after the potential of the wiring DL is initialized by turning on the switch 17, the potential of the wiring DL is kept initialized.

The PLD according to one embodiment of the present invention includes the storage device 10 in a logic block (LB). In the logic block, the relationship between the logic level of a signal input and the logic level of a signal output is determined by the potential of the wiring DL. Thus, in one embodiment of the present invention, the potential of the wiring DL is controlled in accordance with configuration data, so that the relationship between the logic level of a signal input to the logic block and the logic level of a signal output from the logic block can also be determined in accordance with the configuration data.

Note that in one embodiment of the present invention, a transistor used as the switch 11 has extremely low off-state current. A transistor including a channel formation region in a film of a semiconductor having a wider band gap and lower intrinsic carrier density than silicon can have significantly lower off-state current than a transistor formed using a normal semiconductor such as silicon or germanium. Thus, the transistor is suitable for the switch 11. Examples of such a semiconductor are an oxide semiconductor and gallium nitride whose bandgap is 2 or more times that of silicon.

Note that unless otherwise specified, off-state current in this specification means current that flows in a cut-off region between a source and a drain of a transistor.

The transistor with such a structure can prevent leakage of electric charge held in the node FD connected to the gate of the transistor 12 when the switch 11 is off. When the electric charge is held in the node FD, the on state or off state of the transistor 12 is kept; thus, the potential of the wiring DL is also held.

Since the node FD becomes floating, i.e., has extremely high insulating properties with another electrode or a wiring in the cell 14 when the switch 11 is off, a boosting effect described below can be expected. In other words, when the node FD is floating in the cell 14, the potential of the node FD is increased by capacitance Cgs generated between the source and the gate of the transistor 12 as the potential of the wiring CL is changed from a low level to a high level. The increase in potential of the node FD depends on the logic level of configuration data input to the gate of the transistor 12. Specifically, when configuration data written to the cell 14 is "0", the transistor 12 is in a weak inversion mode, so that the capacitance Cgs that contributes to the increase in potential of the node FD includes capacitance Cos that is independent of the potential of the gate electrode, that is, the potential of the node FD. Specifically, the capacitance Cos includes overlap capacitance generated in a region where the gate electrode and the source region overlap with each other, and parasitic capacitance generated between the gate electrode and the source electrode, for example. On the other hand, when configuration data written to the cell 14 is "1", the transistor 12 is in a strong inversion mode, so that the capacitance Cgs that contributes to the increase in potential of the node FD includes, in addition to the capacitance Cos, part of capacitance Cox generated between the channel formation region and the gate electrode. Thus, the capacitance Cgs that contributes to the increase in potential of the node FD at the time when the configuration data is "1" is larger than the capacitance Cgs at the time when the configuration data is "0". Consequently, the cell 14 can obtain a boosting effect such that the potential of the node FD at the time when the configuration data is "1" becomes higher than the potential of the node FD at the time when the configuration data is "0" with a change in the potential of the wiring CL. Accordingly, in the case where the configuration data is "1", the transistor 12 can be turned on reliably and the switching speed of the cell 14 can be increased because the potential of the node FD can be increased by the boosting effect even when the potential of the node FD is decreased from the potential of a signal including configuration data input to the wiring BL by the threshold voltage of the transistor used as the switch 11. Furthermore, the transistor 12 can be turned off reliably in the case where the configuration data is "0".

A source of a transistor means a source region that is part of a semiconductor film functioning as an active layer or a source electrode that is electrically connected to the semiconductor film. Similarly, a drain of a transistor means a drain region that is part of a semiconductor film functioning as an active layer or a drain electrode that is electrically connected to the semiconductor film. A gate means a gate electrode.

The terms "source" and "drain" of a transistor interchange with each other depending on the conductivity type of the transistor or levels of potentials applied to terminals. In general, in an n-channel transistor, a terminal to which a low potential is applied is called a source, and a terminal to which a high potential is applied is called a drain. Furthermore, in a p-channel transistor, a terminal to which a low potential is applied is called a drain, and a terminal to which a high potential is applied is called a source. In this specification, although the connection relationship of the transistor is described assuming that the source and the drain are fixed in some cases for convenience, actually, the names of the source and the drain interchange with each other depending on the relationship of the potentials.

When power supply voltage is lowered to reduce the power consumption of the PLD, the on-state current of a transistor is decreased, so that the operation speed of the PLD is also decreased. However, in one embodiment of the present invention, by lowering power supply voltage supplied to the PLD, even when the voltage of a signal input to the gate of the transistor 12 is lowered, i.e., even when a potential applied to the gate of the transistor 12 is lowered, the storage device 10 can operate correctly by the boosting effect.

Note that FIG. 1 illustrates an example in which one of a source and a drain of the transistor 12 is connected to the wiring CL and the other of the source and the drain of the transistor 12 is connected to the wiring DL through the switch 13. In one embodiment of the present invention, one of the source and the drain of the transistor 12 may be connected to the wiring CL through the switch 13 and the other of the source and the drain of the transistor 12 may be connected to the wiring DL.

The potentials of the wiring DL and the wiring BL are likely to become floating after the PLD is powered off. If the PLD is powered off for too long, configuration data retained in the storage device 10 might be lost. In that case, when the PLD is powered on, the wiring DL and the wiring BL are brought into conduction through the storage device 10, and a large amount of current might flow to these wirings when the wiring DL and the wiring BL have different potentials. However, in one embodiment of the present invention, the potential of the wiring DL can be initialized as described above, so that a large amount of current can be prevented from flowing between the wiring DL and the wiring BL. This can prevent breakage of the PLD.

The potential of an input terminal of the logic block might become an intermediate potential between a high-level potential and a low-level potential immediately after the PLD is powered on. If the intermediate potential is input to the input terminal of the logic block, flow-through current is likely to be generated in a CMOS circuit included in the logic block. However, in one embodiment of the present invention, since the potential of the wiring DL can be initialized as described above, the input terminal can be prevented from having the intermediate potential immediately after the PLD is powered on; thus, generation of the flow-through current can be prevented.

In the PLD according to one embodiment of the present invention, after the PLD is powered on and the potential of the wiring DL is initialized, configuration data with which the switch 13 is turned off in all the cells 14 included in the storage device 10 may be written to a configuration memory. Accordingly, the wiring DL and the plurality of wirings BL can be electrically isolated from each other. Thus, when the wiring DL and the plurality of wirings BL have different potentials, a large amount of current can be prevented from flowing to these wirings. This can prevent breakage of the PLD.

Figure 2:
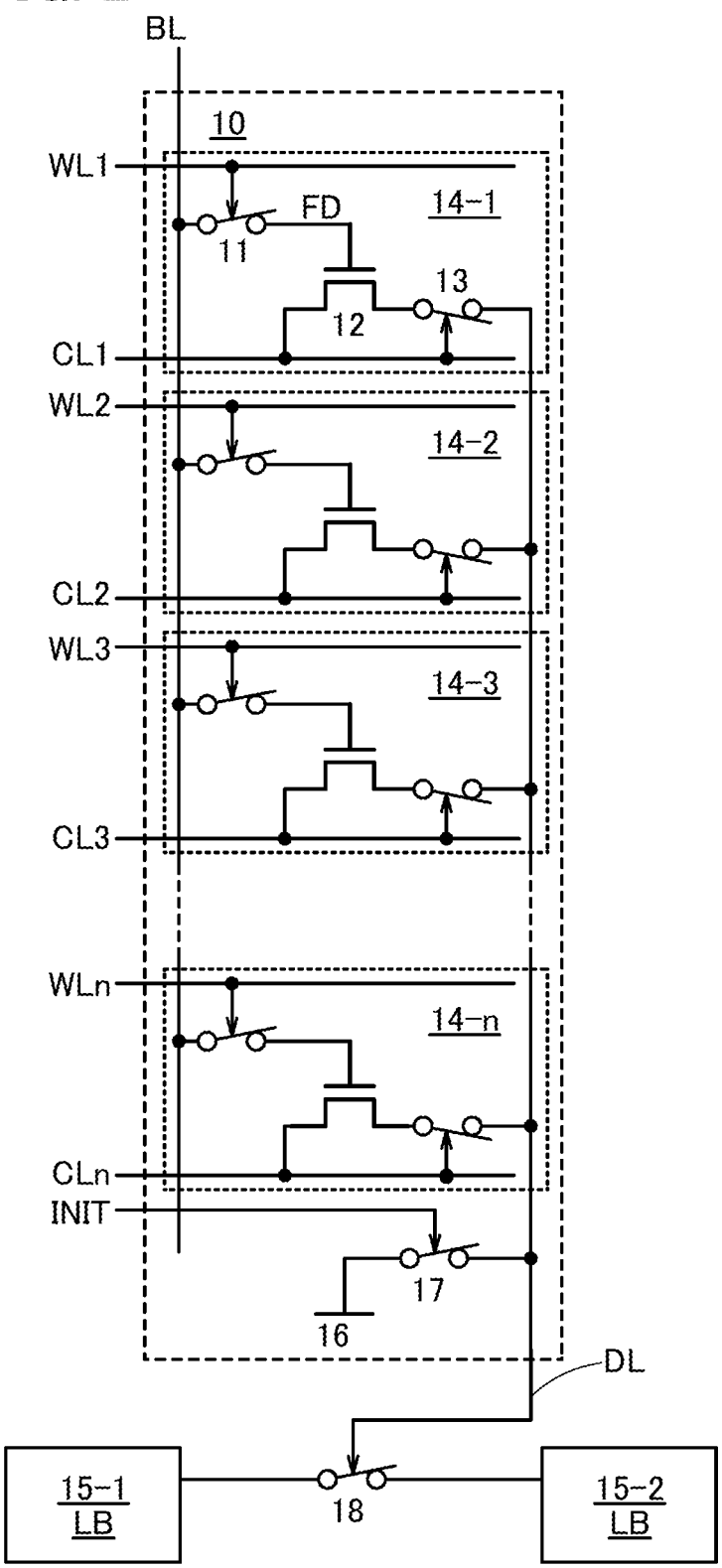
FIG. 2 illustrates a storage device structure.

FIG. 2 illustrates a PLD structure example in which the electrical connection between a plurality of logic blocks 15 is controlled in accordance with the potential of the wiring DL electrically connected to the storage device 10 in FIG. 1.

FIG. 2 illustrates the storage device 10, a switch 18 that is turned on or off in accordance with the potential of the wiring DL electrically connected to the storage device 10, and logic blocks 15-1 and 15-2. The electrical connection between the logic blocks 15-1 and 15-2 is controlled by the switch 18. The logic blocks 15-1 and 15-2 are examples of the plurality of logic blocks 15.

Specifically, when the switch 18 is turned on in accordance with the potential of the wiring DL, the logic blocks 15-1 and 15-2 are electrically connected to each other. When the switch 18 is turned off in accordance with the potential of the wiring DL, the logic blocks 15-1 and 15-2 are electrically isolated from each other.

Thus, it is possible to control the electrical connection between the logic blocks 15-1 and 15-2 in accordance with the configuration data retained in the storage device 10.

<Operation Example of Storage Device>

Next, an operation example of the storage device 10 in FIG. 1 or FIG. 2 is described. FIGS. 3A to 3D schematically illustrate the operation of the storage device 10.

Figure 3A:
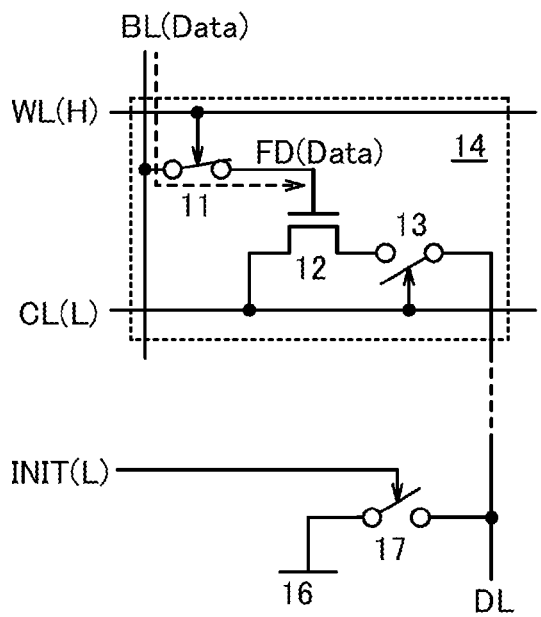
FIGS. 3A to 3D schematically illustrate storage device operation.

First, as illustrated in FIG. 3A, the switch 11 is turned on when a high-level (H) potential is input to the wiring WL, and the switch 13 is turned off when a low-level (L) potential is input to the wiring CL. Furthermore, when a signal (Data) including configuration data is input to the wiring BL, the signal is input to the node FD through the switch 11.

Note that in the case where the logic level of the signal (Data) including configuration data is "1" and the potential of the signal is high (H), the high-level (H) potential is input to the node FD. Note that in that case, the potential actually input to the node FD is decreased from the potential of the wiring BL by the threshold voltage of the transistor used as the switch 11. Furthermore, in the case where the logic level of the signal (Data) including configuration data is "0" and the potential of the signal is low (L), the low-level (L) potential is input to the node FD.

In FIG. 3A, the potential of the signal INIT becomes low (L) and the switch 17 is turned off.

Figure 3B:
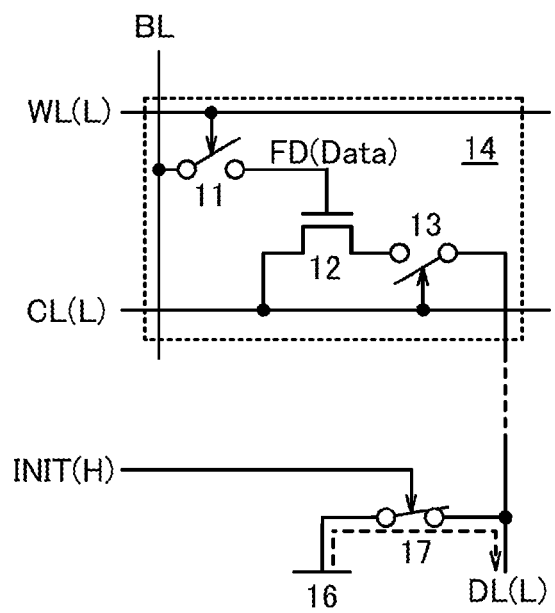

Next, as illustrated in FIG. 3B, the switch 11 is turned off when a low-level (L) potential is input to the wiring WL. Thus, the node FD becomes floating and the signal (Data) including configuration data is held in the node FD. Furthermore, when a low-level (L) potential is input to the wiring CL, the switch 13 is kept off.

In FIG. 3B, the potential of the signal INIT becomes high (H) and the switch 17 is turned on. A low-level (L) potential is input to the wiring 16, and the low-level potential (L) is input to the wiring DL through the switch 17.

Figure 3C:
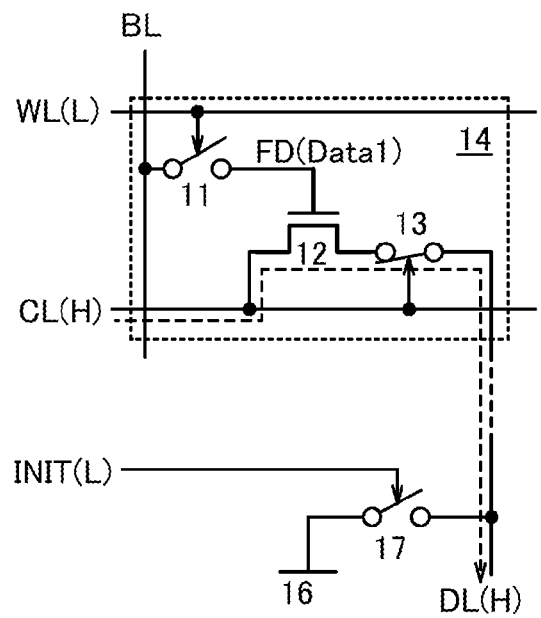

Next, as illustrated in FIG. 3C, the switch 11 is kept off when a low-level (L) potential is input to the wiring WL. Thus, the node FD is kept floating and the signal (Data) including configuration data is kept in the node FD. Furthermore, when a high-level (H) potential is input to the wiring CL, the switch 13 is turned on.

In FIG. 3C, the potential of the signal INIT becomes low (L) and the switch 17 is turned off.

Figure 4A:
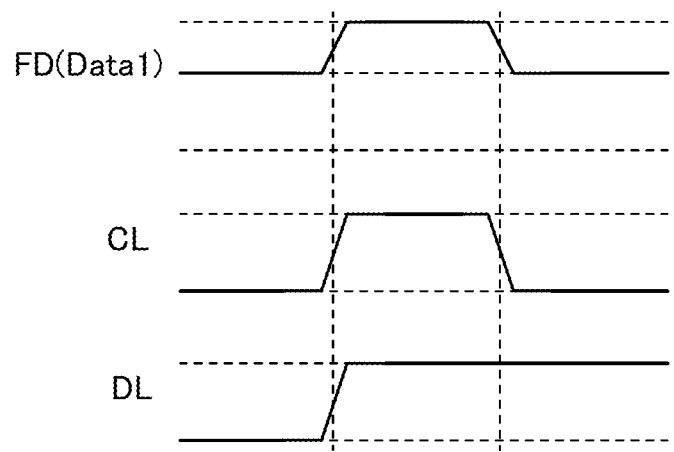
FIGS. 4A and 4B are timing charts.

Note that in FIG. 3C, the logic level of the configuration data of the signal held in the node FD is "1". FIG. 4A shows changes in the potential of the node FD, the potential of the wiring CL, and the potential of the wiring DL at the time when a signal (Data1) including configuration data whose logic level is "1" is held in the node FD. When the logic level of the configuration data is "1", the transistor 12 is in a strong inversion mode and the node FD is floating. Accordingly, in FIG. 3A, even when a potential actually input to the node FD is decreased from the potential of the wiring BL by the threshold voltage of the transistor used as the switch 11, the potential of the node FD is increased by the boosting effect while the potential of the wiring CL is changed from a low level (L) to a high level (H), as illustrated in FIG. 4A. Consequently, the transistor 12 is turned on, and the high-level (H) potential input to the wiring CL is input to the wiring DL through the switch 13 and the transistor 12.

Figure 3D:
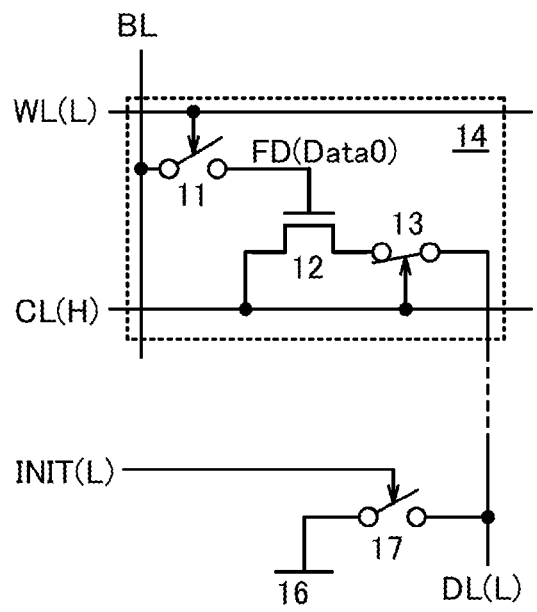

Furthermore, FIG. 3D schematically illustrates the operation of the storage device 10 that is similar to the operation of the storage device 10 in FIG. 3C in that a low-level (L) potential is input to the wiring WL, a high-level (H) potential is input to the wiring CL, and the potential of the signal INIT is low (L) but is different from the operation of the storage device 10 in FIG. 3C in that the logic level of the configuration data of a signal held in the node FD is "0".

Figure 4B:
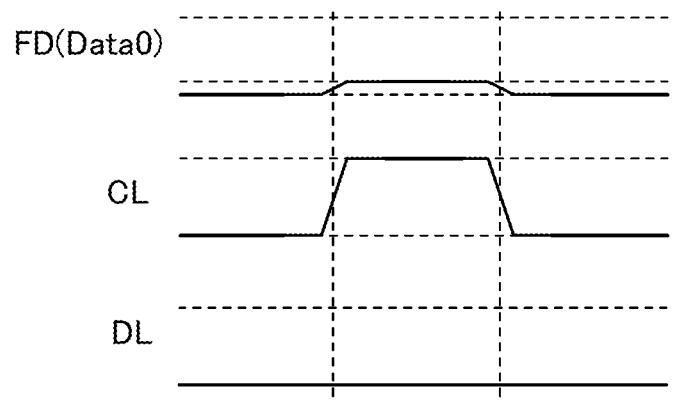

FIG. 4B shows changes in the potential of the node FD, the potential of the wiring CL, and the potential of the wiring DL at the time when a signal (Data0) including configuration data whose logic level is "0" is held in the node FD. As illustrated in FIG. 4B, when the logic level of the configuration data is "0", the node FD is floating; thus, the potential of the node FD is increased by the boosting effect while the potential of the wiring CL is changed from a low level (L) to a high level (H). Note that since the transistor 12 is in a weak inversion mode, the increase in the potential of the node FD is small compared with the case where the transistor 12 is in a strong inversion mode as illustrated in FIG. 4A. Consequently, in FIG. 3D, the transistor 12 is kept off, so that the high-level (H) potential input to the wiring CL is not input to the wiring DL. Accordingly, the potential of the wiring DL is kept low (L).

<Specific Structure Example of Storage Device>

Figure 5:
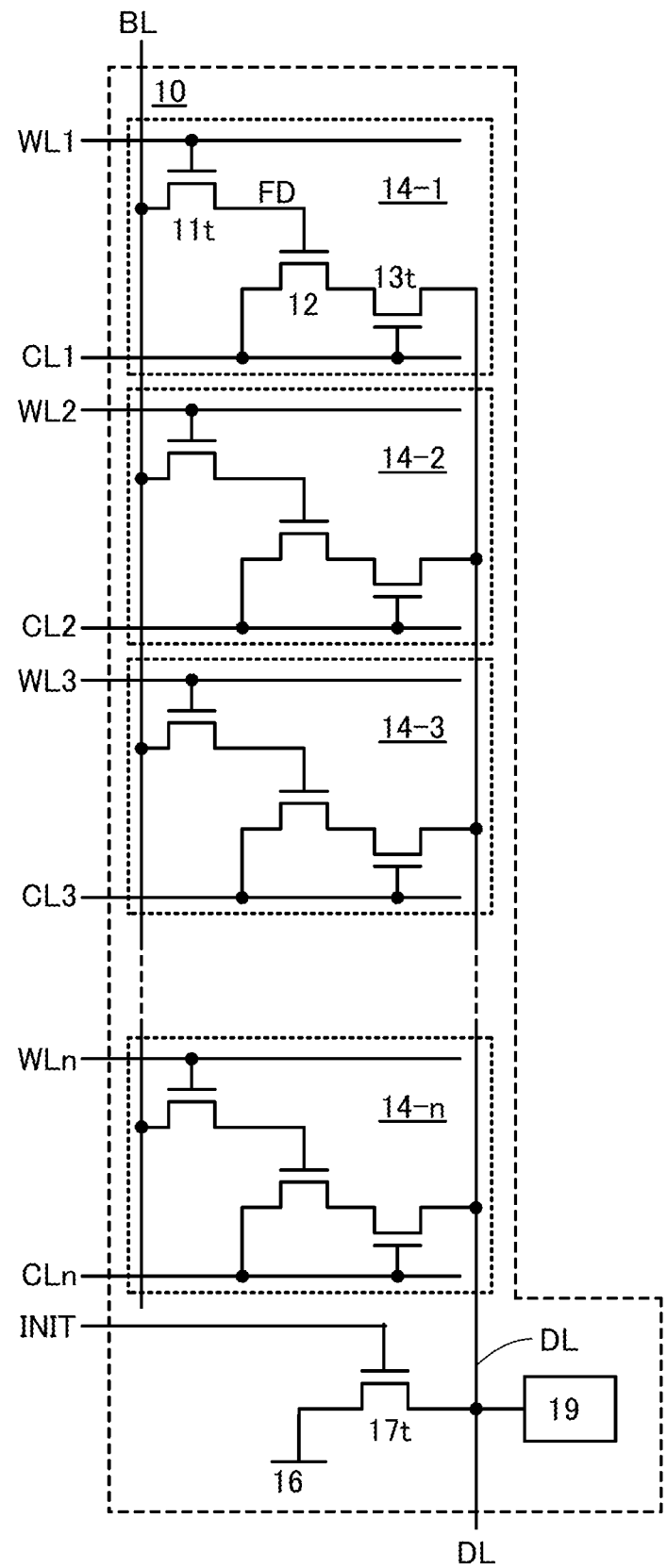
FIG. 5 illustrates a storage device structure.

Next, FIG. 5 illustrates a specific structure example of the storage device 10 in FIG. 1.

The storage device 10 in FIG. 5 includes the plurality of cells 14 each including at least a transistor 11*t* functioning as the switch 11, the transistor 12, and a transistor 13*t* functioning as the switch 13. FIG. 5 illustrates an example in which the storage device 10 includes the plurality of cells 14 (cells 14-1 to 14-*n*).

A gate of the transistor 11*t* is connected to one of the plurality of wirings WL (wirings WL1 to WL*n*). One of a source and a drain of the transistor 11*t* is connected to the wiring BL, and the other of the source and the drain of the transistor 11*t* is connected to the gate of the transistor 12. One of the source and the drain of the transistor 12 is connected to one of the plurality of wirings CL (wirings CL1 to CL*n*), and the other of the source and the drain of the transistor 12 is connected to one of a source and a drain of the transistor 13*t*. A gate of the transistor 13*t* is connected to one of the wirings CL. The other of the source and the drain of the transistor 13*t* is connected to the wiring DL.

Note that the transistor 13*t* may be provided between the transistor 12 and the wiring CL. In that case, specifically, one of the source and the drain of the transistor 13*t* is connected to one of the plurality of wirings CL (wirings CL1 to CL*n*), and the other of the source and the drain of the transistor 13*t* is connected to one of the source and the drain of the transistor 12. The other of the source and the drain of the transistor 12 is connected to the wiring DL.

FIG. 5 also illustrates an example in which a latch 19 is connected to the wiring DL. The latch 19 has a function of keeping the potential of the wiring DL high or low.

Figure 8:
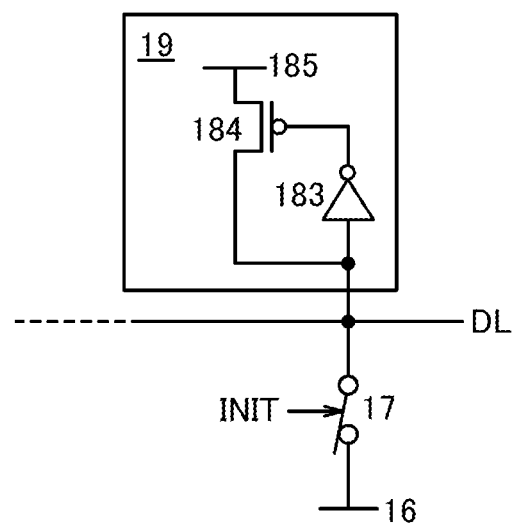
FIG. 8 illustrates a latch structure.

FIG. 8 illustrates a structure example of the latch 19. The latch 19 in FIG. 8 includes an inverter 183 and a p-channel transistor 184. An input terminal of the inverter 183 is electrically connected to the wiring DL. An output terminal of the inverter 183 is electrically connected to a gate of the transistor 184. One of a source and a drain of the transistor 184 is electrically connected to a wiring 185 supplied with a potential that is higher than a potential applied to the wiring 16. The other of the source and the drain of the transistor 184 is electrically connected to the wiring DL.

In one embodiment of the present invention, the latch 19 with the above structure is electrically connected to the wiring DL, so that the potential of the wiring DL can be kept high or low after the PLD is powered on. Accordingly, application of an intermediate potential to the wiring DL can prevent generation of flow-through current in the logic block 15 having the input terminal connected to the wiring DL.

Figure 6:
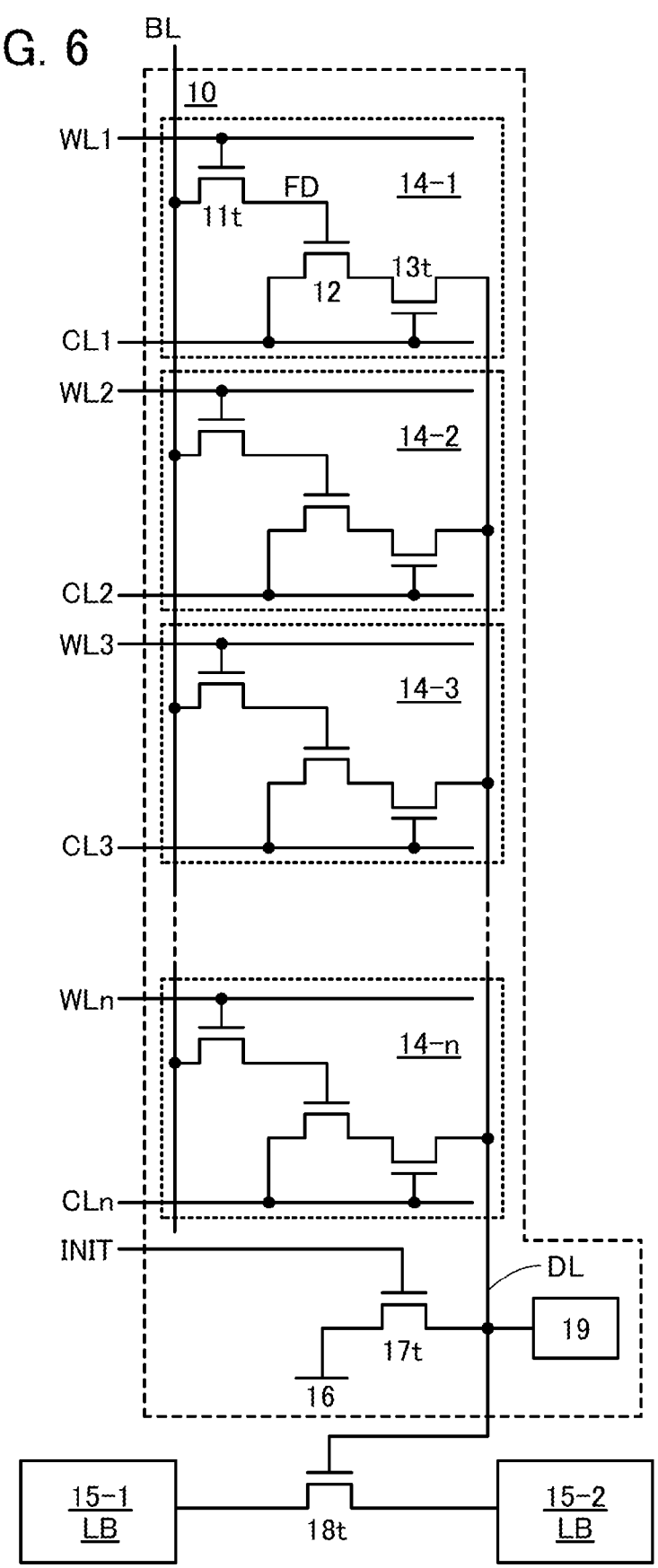
FIG. 6 illustrates a storage device structure.

FIG. 6 illustrates a PLD structure example in which the electrical connection between the plurality of logic blocks 15 is controlled in accordance with the potential of the wiring DL electrically connected to the storage device 10 in FIG. 5.

FIG. 6 illustrates the storage device 10, a transistor 18*t* functioning as the switch 18 that is turned on or off in accordance with the potential of the wiring DL electrically connected to the storage device 10, and the logic blocks 15-1 and 15-2. The electrical connection between the logic blocks 15-1 and 15-2 is controlled by the transistor 18*t*.

<Specific Operation Example of Storage Device>

Figure 7:
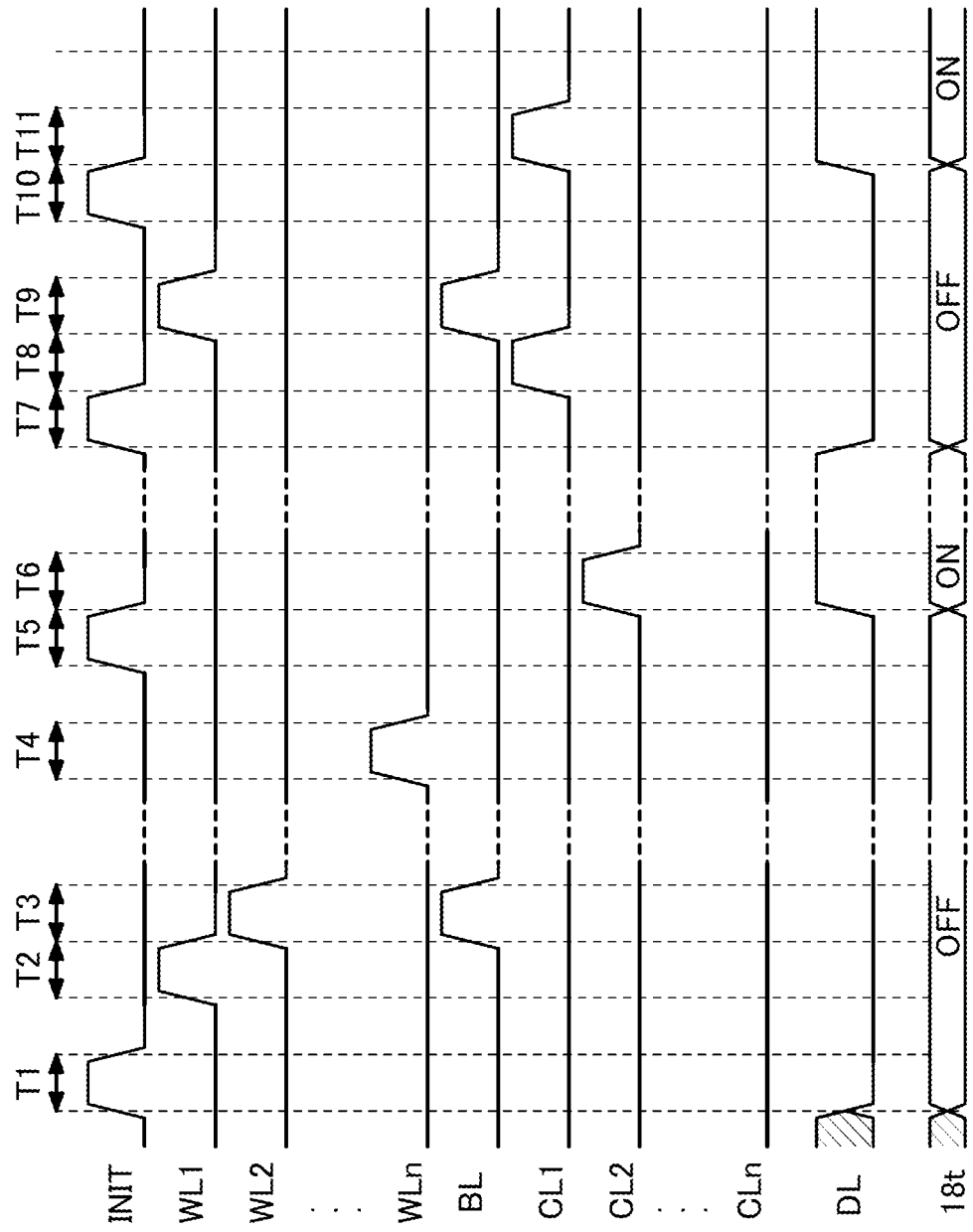
FIG. 7 is a timing chart.

Next, an operation example of the storage device 10 in FIG. 6 is described with reference to a timing chart in FIG. 7.

First, in a period T1, the potentials of the wirings WL1 to WL*n*, the wiring BL, and the wirings CL1 to CL*n* are all set low and the potential of the signal INIT is set high, so that a transistor 17*t* is turned on. Thus, the potential of the wiring 16 is input to the wiring DL through the transistor 17*t*, and the potential of the wiring DL is initialized to a low-level potential. Consequently, the transistor 18*t* is turned off and the logic blocks 15-1 and 15-2 are electrically isolated from each other.

By performing the operation in the period T1 immediately after the PLD is powered on before configuration data is written to the storage device 10, a large amount of current can be prevented from flowing between the wiring DL and the wiring BL. This can prevent breakage of the PLD.

After the period T1 is terminated, the potential of the signal INIT is set low and the transistor 17*t* is turned off.

Next, configuration data is written. Specifically, in a period T2, the potential of the wiring WL1 is set high, so that the transistor 11*t* included in the cell 14-1 is turned on. Note that the potentials of the wirings WL (excluding the wiring WL1), the potential of the signal INIT, and the potentials of the wirings CL1 to CL*n* are kept low.

In the period T2, a signal that includes configuration data with a logic level of "0" and has a low-level potential is input to the wiring BL. Furthermore, the low-level potential is input to the node FD in the cell 14-1 through the transistor 11*t*.

After the period T2 is terminated, the potential of the wiring WL1 is set low and the transistor 11*t* included in the cell 14-1 is turned off. Thus, the configuration data input to the node FD is retained in the node FD.

Next, in a period T3, the potential of the wiring WL2 is set high, so that the transistor 11*t* included in the cell 14-2 is turned on. Note that the potentials of the wirings WL (excluding the wiring WL2), the potential of the signal INIT, and the potentials of the wirings CL1 to CL*n* are kept low.

In the period T3, a signal that includes configuration data with a logic level of "1" and has a high-level potential is input to the wiring BL. Furthermore, the high-level potential is input to the node FD in the cell 14-2 through the transistor 11*t*.

After the period T3 is terminated, the potential of the wiring WL2 is set low and the transistor 11*t* included in the cell 14-2 is turned off. Thus, the configuration data input to the node FD is retained in the node FD.

Then, after the period T3 is terminated before a period T4 is started, by setting the potentials of the wirings WL3 to WL*n* high sequentially, signals including configuration data are input to and held in the nodes FD in the cells 14-3 to 14-*n* sequentially as in the periods T2 and T3. By the operations from the period T2 to the period T4, configuration data is written to all the cells 14.

Next, before configuration of the PLD is performed in accordance with configuration data, the potential of the wiring DL is initialized to a low-level potential in a period T5. Specifically, in the period T5, the potentials of the wirings WL1 to WL*n*, the wiring BL, and the wirings CL1 to CL*n* are all set low and the potential of the signal INIT is set high, so that the transistor 17*t* is turned on. By this operation, the potential of the wiring 16 is input to the wiring DL through the transistor 17*t*, and the potential of the wiring DL is initialized to a low-level potential.

Then, in a period T6, configuration is performed in accordance with the configuration data retained in the node FD in the cell 14-2. Specifically, in the period T6, the potential of the wiring CL2 is set high, so that the transistor 13*t* included in the cell 14-2 is turned on. Since the configuration data whose logic level is "1" is retained in the node FD in the cell 14-2, when the potential of the wiring CL2 is set high, the high-level potential is input to the wiring DL through the transistor 12 and the transistor 13*t* that are on. Consequently, the transistor 18*t* is turned on and the logic blocks 15-1 and 15-2 are electrically connected to each other.

Note that in the period T6, the potentials of the wirings CL (excluding the wiring CL2), the potential of the signal INIT, and the potentials of the wirings WL1 to WL*n* are kept low.

After the period T6 is terminated, the potential of the wiring CL2 is set low and the transistor 13*t* included in the cell 14-2 is turned off. Thus, a gate potential of the transistor 18*t* is held and the transistor 18*t* is kept on.

Next, before second configuration is performed in accordance with configuration data, the potential of the wiring DL is initialized to a low-level potential in a period T7. Specifically, in the period T7, the potentials of the wirings WL1 to WLn, the wiring BL, and the wirings CL1 to CLn are all set low and the potential of the signal INIT is set high, so that the transistor 17*t* is turned on. By this operation, the potential of the wiring 16 is input to the wiring DL through the transistor 17*t*, and the potential of the wiring DL is initialized to a low-level potential. Consequently, the transistor 18*t* is turned off and the logic blocks 15-1 and 15-2 are electrically isolated from each other.

Then, in a period T8, the second configuration is performed in accordance with the configuration data retained in the node FD in the cell 14-1. Specifically, in the period T8, the potential of the wiring CL1 is set high, so that the transistor 13*t* included in the cell 14-1 is turned on. Since the configuration data whose logic level is "0" is retained in the node FD in the cell 14-1, even when the potential of the wiring CL1 is set high and the transistor 13*t* is turned on, the transistor 12 is off. Consequently, the high-level potential of the wiring CL1 is not input to the wiring DL and the transistor 18*t* is kept off, so that the logic blocks 15-1 and 15-2 are kept electrically isolated from each other.

Note that in the period T8, the potentials of the wirings CL (excluding the wiring CL1), the potential of the signal INIT, and the potentials of the wirings WL1 to WLn are kept low.

After the period T8 is terminated, the potential of the wiring CL1 is set low and the transistor 13*t* included in the cell 14-1 is turned off. Thus, the gate potential of the transistor 18*t* is held and the transistor 18*t* is kept off.

Next, in a period T9, while the connection between the logic blocks 15-1 and 15-2 is not changed, configuration data is written to some of the cells 14 again. Specifically, in the period T9, the potential of the wiring WL1 is set high, so that the transistor 11*t* included in the cell 14-1 is turned on. Note that the potentials of the wirings WL (excluding the wiring WL1), the potential of the signal INIT, and the potentials of the wirings CL1 to CLn are kept low.

In the period T9, a signal that includes configuration data with a logic level of "1" and has a high-level potential is input to the wiring BL. Furthermore, the high-level potential is input to the node FD in the cell 14-1 through the transistor 11*t*.

After the period T9 is terminated, the potential of the wiring WL1 is set low and the transistor 11*t* included in the cell 14-1 is turned off. Thus, the configuration data input to the node FD is retained in the node FD.

Next, before third configuration is performed in accordance with configuration data, the potential of the wiring DL is initialized to a low-level potential in a period T10. Specifically, in the period T10, the potentials of the wirings WL1 to WLn, the wiring BL, and the wirings CL1 to CLn are all set low and the potential of the signal INIT is set high, so that the transistor 17*t* is turned on. By this operation, the potential of the wiring 16 is input to the wiring DL through the transistor 17*t*, and the potential of the wiring DL is initialized to a low-level potential.

Then, in a period T11, the third configuration is performed in accordance with the configuration data retained in the node FD in the cell 14-1. Specifically, in the period T11, the potential of the wiring CL1 is set high, so that the transistor 13*t* included in the cell 14-1 is turned on. Since the configuration data whose logic level is "1" is retained in the node FD in the cell 14-1, when the potential of the wiring CL1 is set high, the high-level potential is input to the wiring DL through the transistor 12 and the transistor 13*t* that are on. Consequently, the transistor 18*t* is turned on and the logic blocks 15-1 and 15-2 are electrically connected to each other.

Note that in the period T11, the potentials of the wirings CL (excluding the wiring CL1), the potential of the signal INIT, and the potentials of the wirings WL1 to WLn are kept low.

After the period T11 is terminated, the potential of the wiring CL1 is set low and the transistor 13*t* included in the cell 14-1 is turned off. Thus, the gate potential of the transistor 18*t* is held and the transistor 18*t* is kept on.

Note that the gate of the transistor 18*t* becomes floating, i.e., has extremely high insulating properties with another electrode or a wiring when the potentials of all the wirings CL are low. Accordingly, in the case where the configuration data is "1", the gate potential of the transistor 18*t* can be increased by the boosting effect even when the gate potential of the transistor 18*t* is decreased by the threshold voltages of the transistor 12 and the transistor 13*t*. Consequently, the transistor 18*t* can be turned on reliably and the switching speed of the transistor 18*t* can be increased. Furthermore, the transistor 18*t* can be turned off reliably in the case where the configuration data is "0".

<Structure Example of Logic Block>

Figure 9A:
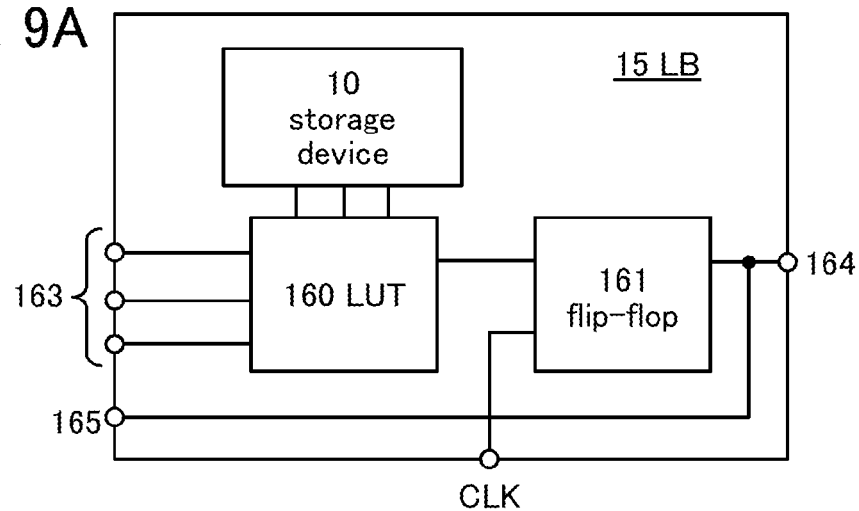
FIGS. 9A to 9C each illustrate a logic block structure.

FIG. 9A illustrates one mode of the logic block (LB) 15. The logic block 15 in FIG. 9A includes a look-up table (LUT) 160, a flip-flop 161, and the storage device 10. Logical operation of the LUT 160 is determined in accordance with configuration data of the storage device 10. Specifically, one output value of the LUT 160 with respect to input values of a plurality of input signals supplied to input terminals 163 is determined. Then, the LUT 160 outputs a signal including the output value. The flip-flop 161 holds the signal output from the LUT 160 and outputs an output signal corresponding to the signal from a first output terminal 164 and a second output terminal 165 in synchronization with a clock signal CLK.

Note that the logic block 15 may further include a multiplexer circuit. The multiplexer circuit can select whether the output signal from the LUT 160 goes through the flip-flop 161.

Furthermore, the type of the flip-flop 161 may be determined by the configuration data. Specifically, the flip-flop 161 may have a function of any of a D flip-flop, a T flip-flop, a JK flip-flop, and an RS flip-flop depending on the configuration data.

Figure 9B:
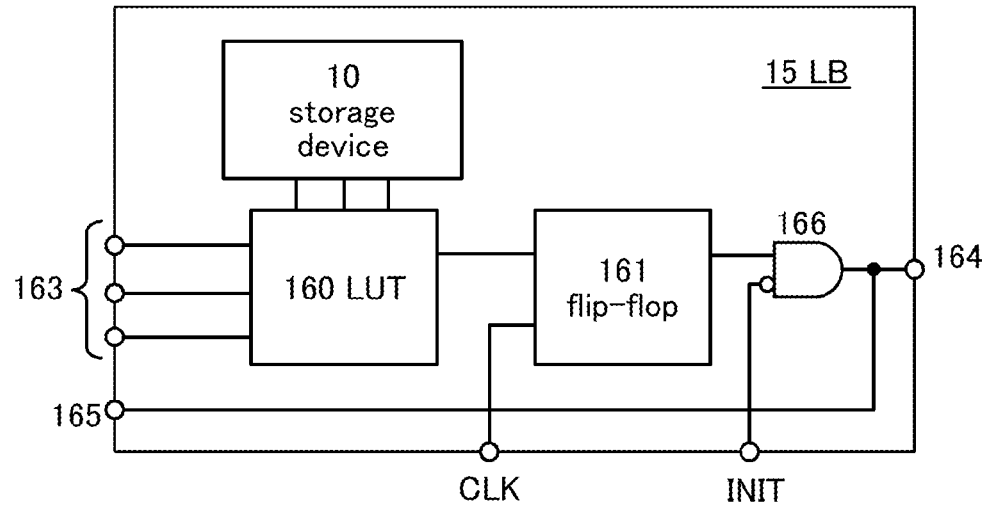

FIG. 9B illustrates another mode of the logic block 15. The logic block 15 in FIG. 9B has a structure in which an AND circuit 166 is added to the logic block 15 in FIG. 9A. To the AND circuit 166, a signal from the flip-flop 161 is supplied as a positive logic input, and the signal INIT for initializing the potential of the wiring DL in FIG. 1 is supplied as a negative logic input. With such a structure, when the potential of the wiring DL is initialized in accordance with the signal INIT, the potential of a wiring supplied with a signal output from the logic block 15 can be initialized to a low-level potential that is equal to the potential of the wiring 16. Consequently, a large amount of current can be prevented from flowing between the logic blocks 15 in FIG. 1, so that breakage of the PLD can be prevented.

Figure 9C:
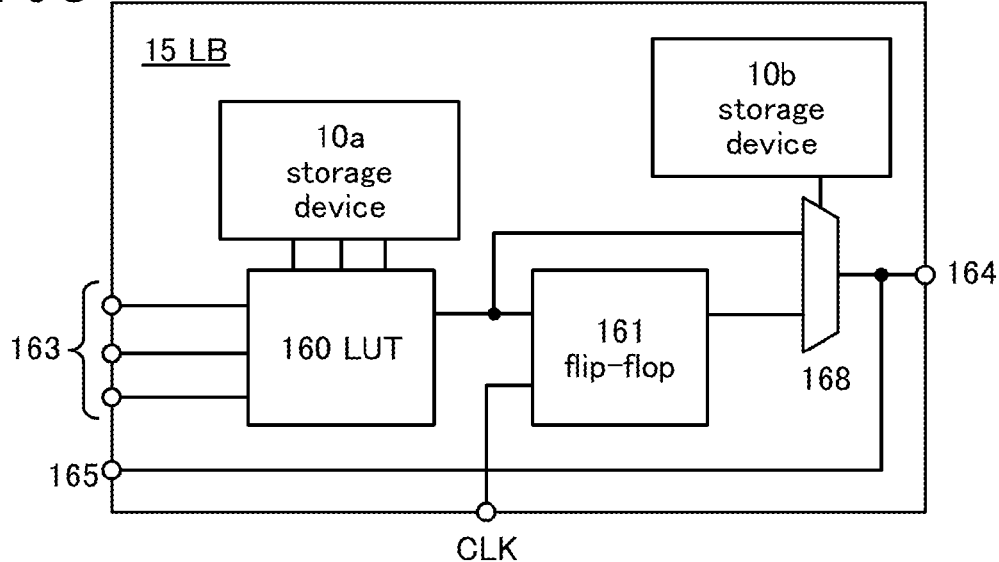

FIG. 9C illustrates another mode of the logic block 15. The logic block 15 in FIG. 9C has a structure in which a multiplexer 168 is added to the logic block 15 in FIG. 9A. The logic block 15 in FIG. 9C further includes two storage devices 10 (storage devices 10*a* and 10*b*). Logical operation of the LUT 160 is determined in accordance with configuration data of the storage device 10*a*. A signal output from the LUT 160 and a signal output from the flip-flop 161 are input to the multiplexer 168. The multiplexer 168 has functions of selecting and outputting one of the two output signals in accordance with configuration data stored in the storage device 10b. The signal output from the multiplexer 168 is output from the first output terminal 164 and the second output terminal 165.

<PLD Structure Example>

Figure 10A:
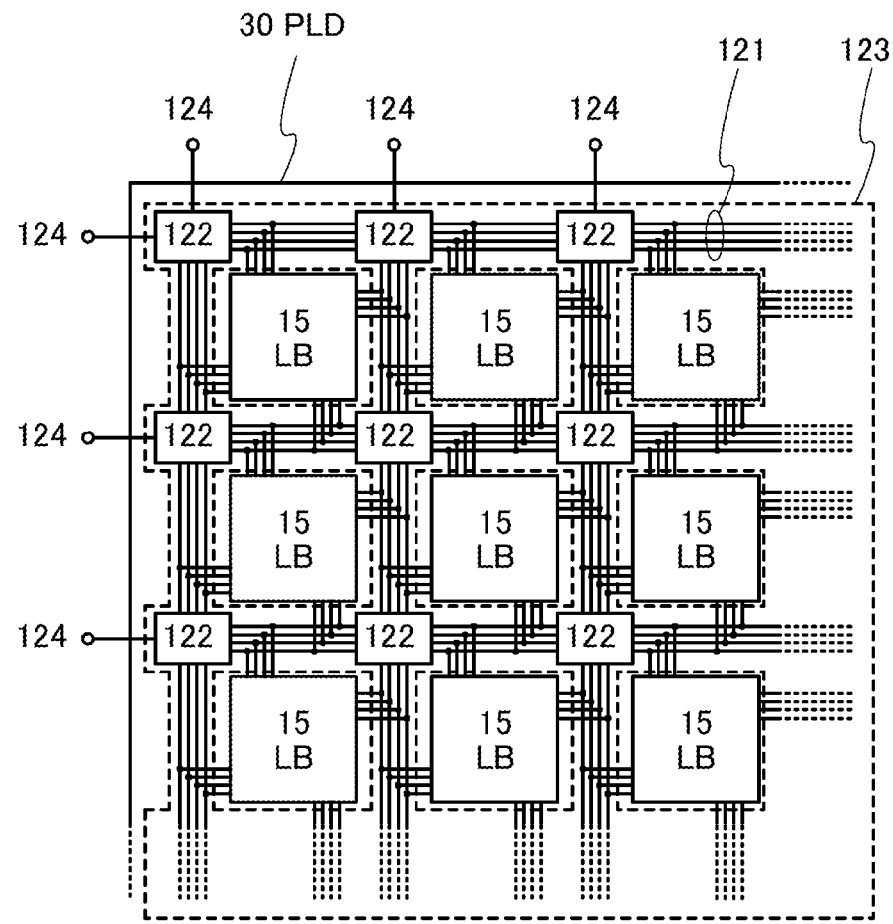
FIG. 10A illustrates part of a structure of a PLD 30.

FIG. 10A schematically illustrates part of the structure of the PLD 30. The PLD 30 in FIG. 10A includes the plurality of logic blocks (LB) 15, a wiring group 121 connected to any of the plurality of logic blocks 15, and switch circuits 122 for controlling the connection between the wirings included in the wiring group 121. The wiring group 121 and the switch circuits 122 correspond to a routing resource 123. The connection between the wirings controlled by the switch circuits 122 are determined by the configuration data of the storage device 10 in FIG. 1.

Figure 10B:
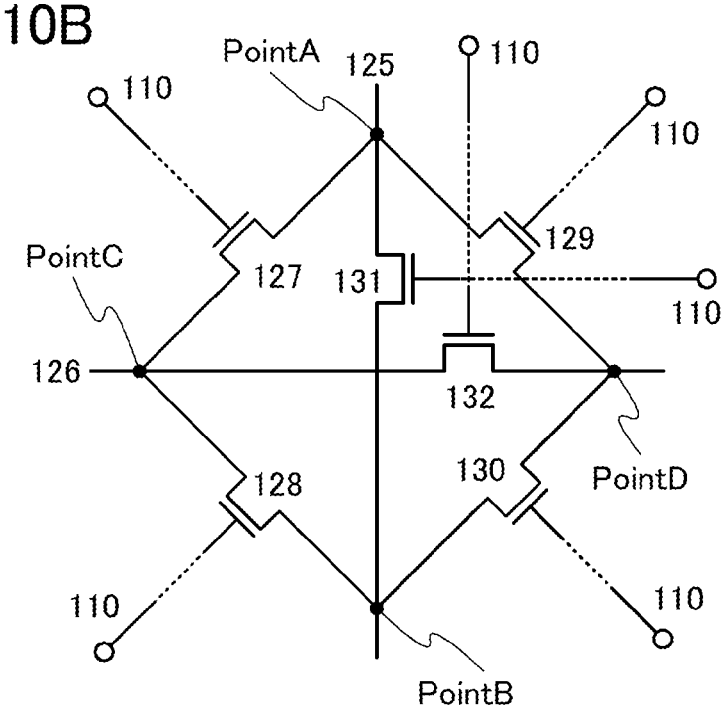
FIG. 10B illustrates a switch circuit structure.

FIG. 10B illustrates a structure example of the switch circuit 122. The switch circuit 122 in FIG. 10B has a function of controlling the connection between a wiring 125 and a wiring 126 included in the wiring group 121. Specifically, the switch circuit 122 includes transistors 127 to 132. The transistor 127 has a function of controlling the electrical connection between a point A of the wiring 125 and a point C of the wiring 126. The transistor 128 has a function of controlling the electrical connection between a point B of the wiring 125 and the point C of the wiring 126. The transistor 129 has a function of controlling the electrical connection between the point A of the wiring 125 and a point D of the wiring 126. The transistor 130 has a function of controlling the electrical connection between the point B of the wiring 125 and the point D of the wiring 126. The transistor 131 has a function of controlling the electrical connection between the point A and the point B of the wiring 125. The transistor 132 has a function of controlling the electrical connection between the point C and the point D of the wiring 126.

Selection (switching) of the on state or off state of each of the transistors 127 to 132 is determined by the configuration data of the storage device 10. Specifically, in the case of the PLD 30, the potentials of signals input to gates of the transistors 127 to 132 are determined by the potential of the wiring DL connected to the storage device 10 through terminals 110. In other words, each of the transistors 127 to 132 functions as the switch 18 illustrated in FIG. 2.

The switch circuits 122 also have a function of controlling the electrical connection between the wiring group 121 and output terminals 124 of the PLD 30.

Figure 11:
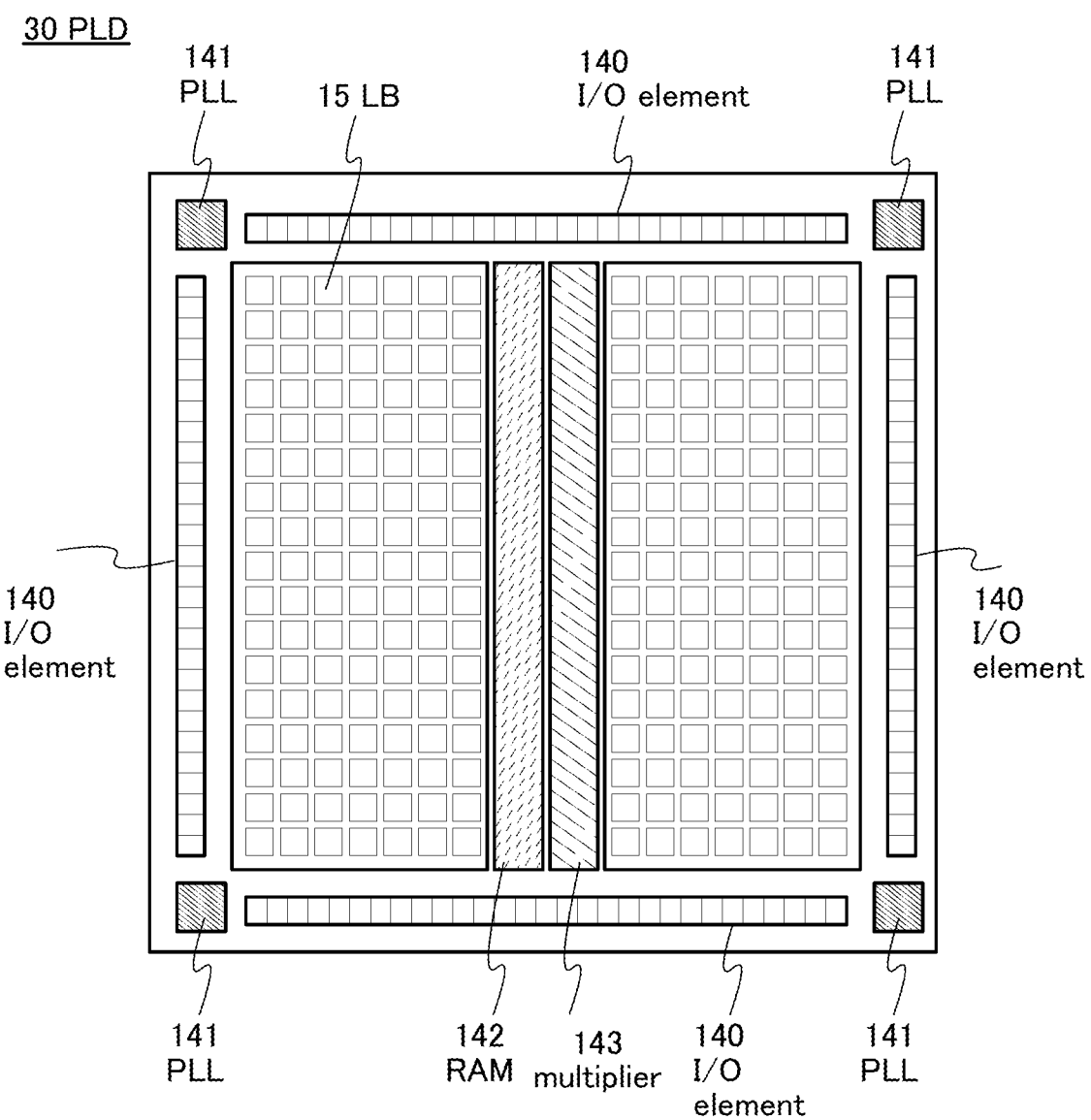
FIG. 11 illustrates a PLD entire structure.

FIG. 11 illustrates a structure example of the entire PLD 30. In FIG. 11, I/O elements 140, phase lock loops (PLL) 141, a RAM 142, and a multiplier 143 are provided in the PLD 30. The I/O element 140 functions as an interface that controls input and output of signals from and to an external circuit of the PLD 30. The PLL 141 has a function of generating a signal CK. The RAM 142 has a function of storing data used for logical operation. The multiplier 143 corresponds to a logic circuit for multiplication. When the PLD 30 has a function of executing multiplication, the multiplier 143 is not necessarily provided.

<Cross-sectional Structure Example of Cell>

Figure 12:
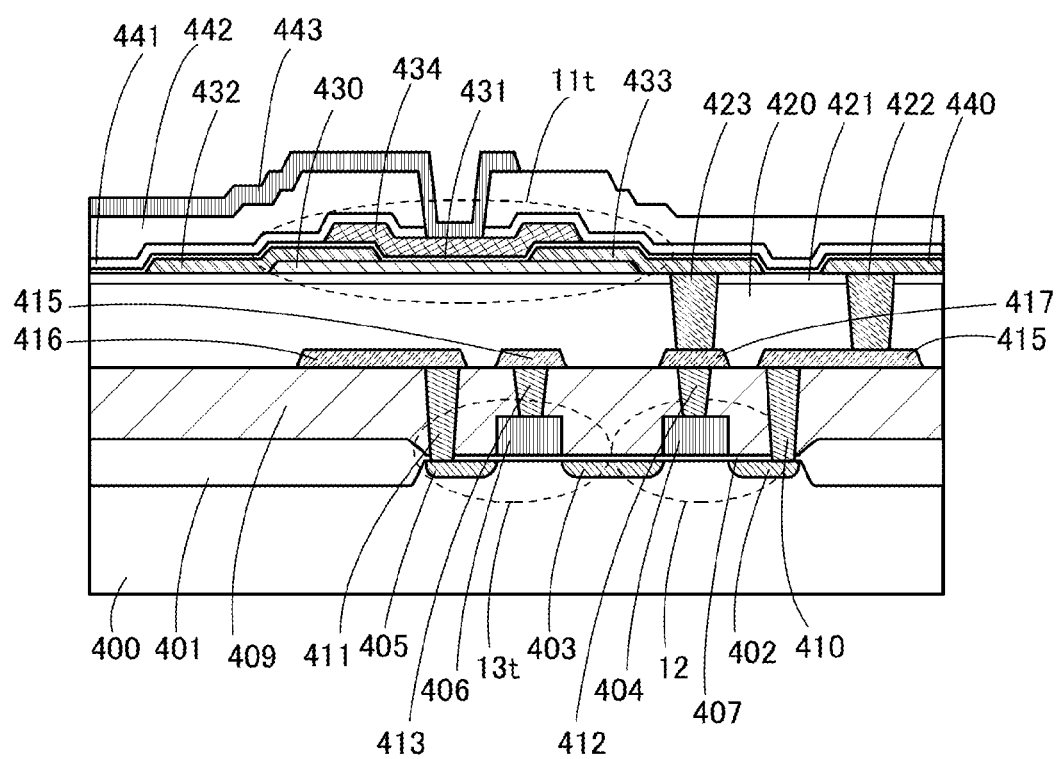
FIG. 12 is a cell cross-sectional view.

FIG. 12 illustrates a cross-sectional structure example of the transistor 11t, the transistor 12, and the transistor 13t included in the cell 14 in FIG. 5 or FIG. 6.

In this embodiment, the transistor 11t including a channel formation region in an oxide semiconductor film is formed over the transistor 12 and the transistor 13t each including a channel formation region in a single crystal silicon substrate.

Note that the transistor 12 or the transistor 13t can include a semiconductor film of silicon, germanium, or the like in an amorphous, microcrystalline, polycrystalline, or single crystal state for an active layer. Alternatively, the transistor 12 or the transistor 13t may include an oxide semiconductor for the active layer. In the case where the transistors each include an oxide semiconductor for the active layer, the transistor 11t is not necessarily stacked over the transistor 12 and the transistor 13t, and the transistor 11t, the transistor 12, and the transistor 13t may be formed in the same layer.

In the case where the transistor 12 or the transistor 13t is formed using a silicon thin film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 400 where the transistor 12 or the transistor 13t is formed can be, for example, an n-type or p-type silicon substrate, germanium substrate, silicon germanium substrate, or compound semiconductor substrate (e.g., GaAs substrate, InP substrate, GaN substrate, SiC substrate, GaP substrate, GaInAsP substrate, or ZnSe substrate). In FIG. 12, a single crystal silicon substrate having n-type conductivity is used.

The transistor 12 or the transistor 13t is electrically isolated from another transistor by an element isolation insulating film 401. The element isolation insulating film 401 can be formed by a local oxidation of silicon (LOCOS) method, a trench isolation method, or the like.

Specifically, the transistor 12 includes impurity regions 402 and 403 that are formed in the semiconductor substrate 400 and function as a source region and a drain region, a gate electrode 404, and a gate insulating film 407 provided between the semiconductor substrate 400 and the gate electrode 404. The gate electrode 404 overlaps with a channel formation region formed between the impurity regions 402 and 403 with the gate insulating film 407 positioned between the gate electrode 404 and the channel formation region.

The transistor 13t includes the impurity region 403 and an impurity region 405 that are formed in the semiconductor substrate 400 and function as a source region and a drain region, a gate electrode 406, and the gate insulating film 407 provided between the semiconductor substrate 400 and the gate electrode 406. The gate electrode 406 overlaps with a channel formation region formed between the impurity regions 403 and 405 with the gate insulating film 407 positioned between the gate electrode 406 and the channel formation region.

An insulating film 409 is provided over the transistor 12 and the transistor 13t. Openings are formed in the insulating film 409. Conductive films 410 and 411 that are in contact with the impurity regions 402 and 405, respectively, a conductive film 412 that is electrically connected to the gate electrode 404, a conductive film 413 that is electrically connected to the gate electrode 406 are formed in the openings.

The conductive film 410 is electrically connected to a conductive film 417 formed over the insulating film 409. The conductive film 411 is electrically connected to a conductive film 416 formed over the insulating film 409. The conductive film 412 is electrically connected to the conductive film 417 formed over the insulating film 409. The conductive film 413 is electrically connected to a conductive film 415 formed over the insulating film 409.

An insulating film 420 and an insulating film 421 are stacked in that order over the conductive films 415 to 417. Openings are formed in the insulating film 420 and the insulating film 421. In the openings, a conductive film 422 electrically connected to the conductive film 415 and a conductive film 423 electrically connected to the conductive film 417 are formed.

In FIG. 12, the transistor 11t and a conductive film 440 are formed over the insulating film 421.

The transistor 11t includes, over the insulating film 421, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433. The conductive film 433 is electrically connected to the conductive film 423.

The conductive film 440 is electrically connected to the conductive film 422.

An insulating film 441 and an insulating film 442 are stacked in that order over the transistor 11t and the conductive film 440. An opening is formed in the insulating films 441 and 442. A conductive film 443 that is in contact with the gate electrode 434 in the opening is provided over the insulating film 442.

Note that in FIG. 12, the transistor 11t includes the gate electrode 434 on at least one side of the semiconductor film 430. Alternatively, the transistor 11t may include a pair of gate electrodes with the semiconductor film 430 positioned therebetween.

When the transistor 11t includes a pair of gate electrodes with the semiconductor film 430 positioned therebetween, a signal for controlling an on state or an off state may be supplied to one of the gate electrodes, and the other of the gate electrodes may be supplied with a potential from another element. In that case, potentials at the same level may be supplied to the pair of gate electrodes, or a fixed potential such as a ground potential may be supplied only to the other of the gate electrodes. By controlling the level of a potential applied to the other of the gate electrodes, the threshold voltage of the transistor can be controlled.

In FIG. 12, the transistor 11t has a single-gate structure where one channel formation region corresponding to one gate electrode 434 is provided. However, the transistor 11t may have a multi-gate structure where a plurality of channel formation regions are formed in one active layer by providing a plurality of gate electrodes electrically connected to each other.

<Semiconductor Film>

A highly-purified oxide semiconductor (purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including a channel formation region in a highly-purified oxide semiconductor film has extremely low off-state current and high reliability.

Specifically, various experiments can prove low off-state current of a transistor including a channel formation region in a highly-purified oxide semiconductor film. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electric charge flowing to or from the capacitor is controlled by the transistor. In the measurement, a highly-purified oxide semiconductor film was used in the channel formation region of the transistor, and the off-state current of the transistor was measured from a change in the amount of electric charge of the capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film in the channel formation region has significantly lower off-state current than a crystalline silicon transistor.

In the case where an oxide semiconductor film is used as the semiconductor film, an oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Furthermore, unlike silicon carbide, gallium nitride, or gallium oxide, with the use of the In—Ga—Zn-based oxide, a transistor with favorable electrical characteristics can be formed over a glass substrate. Furthermore, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, gallium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Ce—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Furthermore, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be obtained comparatively easily. However, even with an In—Ga—Zn-based oxide, mobility can be increased by lowering defect density in a bulk.

The structure of the oxide semiconductor film is described below.

An oxide semiconductor film is roughly classified into a single-crystal oxide semiconductor film and a non-single-crystal oxide semiconductor film. The non-single-crystal oxide semiconductor film means any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) of greater than or equal to 1 nm and less than 10 nm, for example. Thus, the microcrystalline oxide semiconductor film has higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, the term "parallel" indicates that an angle formed between two straight lines is −10 to 10°, and accordingly includes the case where the angle is −5 to 5°. In addition, the term "perpendicular" indicates that an angle formed between two straight lines is 80 to 100°, and accordingly includes the case where the angle is 85 to 95°.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Furthermore, when an impurity is added to the CAAC-OS film, the crystallinity in a region to which the impurity is added is changed, and the crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, changes in electrical characteristics of the transistor due to irradiation with visible light or ultraviolet light are small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

<Electronic Device Examples>

A semiconductor device or programmable logic device according to one embodiment of the present invention can be used for display devices, personal computers, or image reproducing devices provided with recording media (typically, devices that reproduce the content of recording media such as digital versatile discs (DVD) and have displays for displaying the reproduced images). Furthermore, as electronic devices that can include the semiconductor device or programmable logic device according to one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 13A to 13F illustrate specific examples of these electronic devices.

Figure 13A:
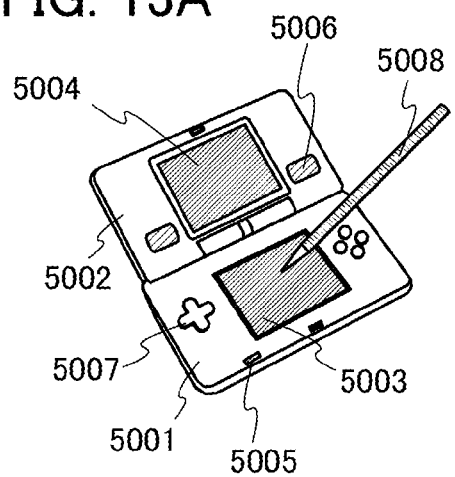
FIGS. 13A to 13F illustrate electronic devices.

FIG. 13A illustrates a portable game machine, which includes a housing 5001, a housing 5002, a display portion 5003, a display portion 5004, a microphone 5005, speakers 5006, an operation key 5007, a stylus 5008, and the like. Note that although the portable game machine in FIG. 13A has the two display portions 5003 and 5004, the number of display portions included in the portable game machine is not limited thereto.

Figure 13B:
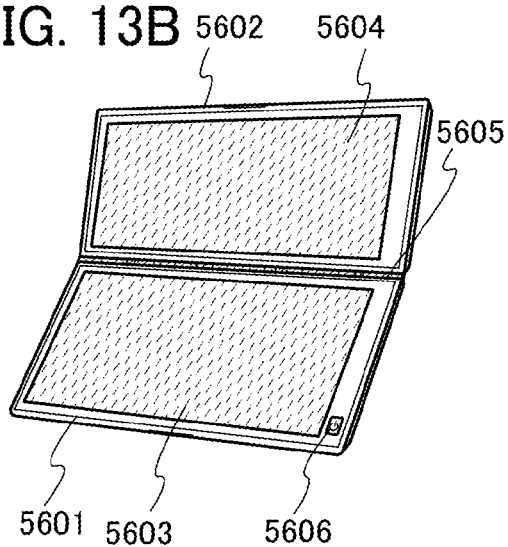

FIG. 13B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 13C:
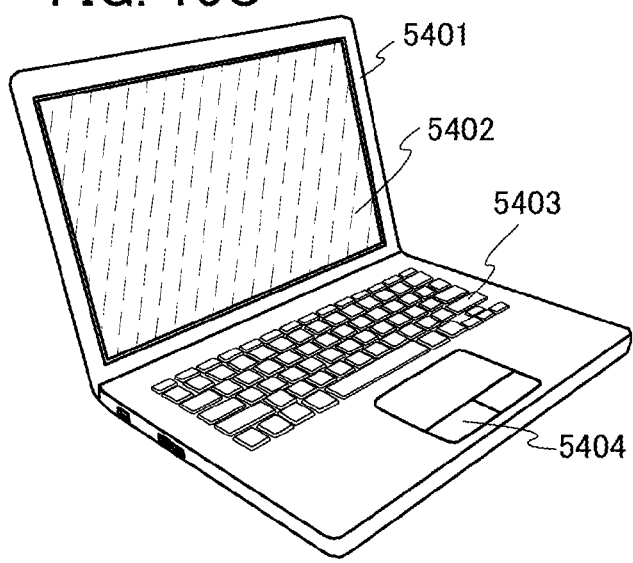

FIG. 13C illustrates a laptop, which includes a housing 5401, a display portion 5402, a keyboard 5403, a pointing device 5404, and the like.

Figure 13D:
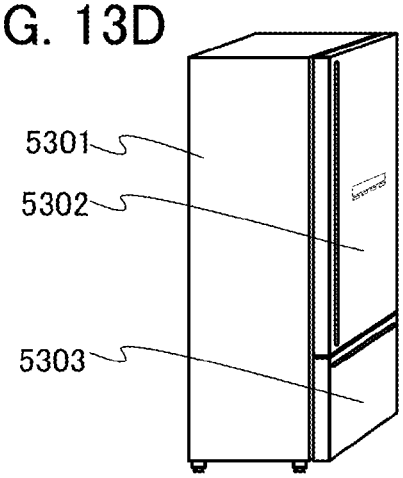

FIG. 13D illustrates an electric refrigerator-freezer, which includes a housing 5301, a refrigerator door 5302, a freezer door 5303, and the like.

Figure 13E:
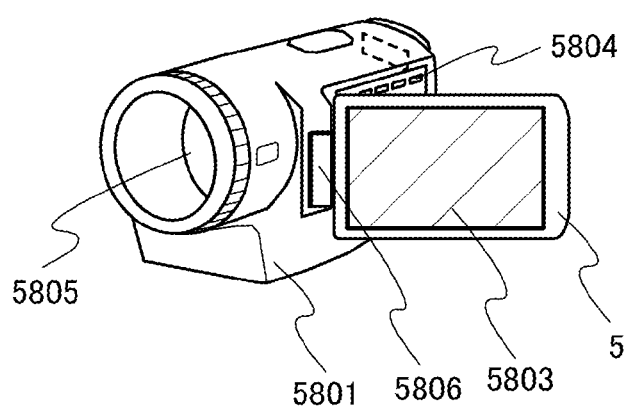

FIG. 13E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 13F:
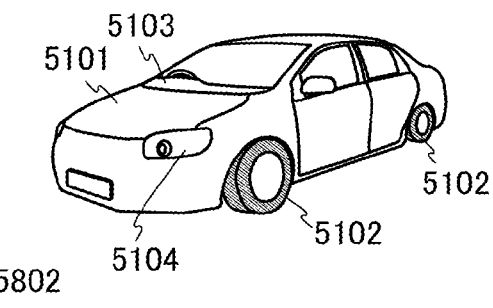

FIG. 13F illustrates an ordinary motor vehicle, which includes a car body 5101, wheels 5102, a dashboard 5103, lights 5104, and the like.

This application is based on Japanese Patent Application serial No. 2013-061256 filed with Japan Patent Office on Mar. 25, 2013, the entire contents of which are hereby incorporated by reference.

What is claimed is:

1. A semiconductor device comprising:
a first circuit comprising:
  a first transistor;
  a second transistor; and
  a third transistor,
  wherein the first to third transistors each comprise:
    a first terminal;
    a second terminal; and
    a gate electrode,
  wherein the gate electrode of the first transistor is electrically connected to a first wiring,
  wherein the first terminal of the first transistor is electrically connected to a second wiring,
  wherein the second terminal of the first transistor is electrically connected to the gate electrode of the second transistor,
  wherein the first terminal of the second transistor is electrically connected to the first terminal of the third transistor,
  wherein the second terminal of the second transistor and the gate electrode of the third transistor are electrically connected to a third wiring, and
  wherein the second terminal of the third transistor is electrically connected to a fourth wiring;
a second circuit comprising:
  a fourth transistor;
  a fifth transistor; and
  a sixth transistor,
  wherein the fourth to sixth transistors each comprise:
    a first terminal;
    a second terminal; and
    a gate electrode,
  wherein the gate electrode of the fourth transistor is electrically connected to a fifth wiring,
  wherein the first terminal of the fourth transistor is electrically connected to the second wiring,
  wherein the second terminal of the fourth transistor is electrically connected to the gate electrode of the fifth transistor,
  wherein the first terminal of the fifth transistor is electrically connected to the first terminal of the sixth transistor,
  wherein the second terminal of the fifth transistor and the gate electrode of the sixth transistor are electrically connected to a sixth wiring, and
  wherein the second terminal of the sixth transistor is electrically connected to the fourth wiring;
a switch electrically connected to the fourth wiring;
a first logic block electrically connected to the switch; and
a second logic block electrically connected to the switch.

2. The semiconductor device according to claim 1, wherein the second transistor comprises an oxide semiconductor film.

3. The semiconductor device according to claim 2, wherein the oxide semiconductor film includes indium, gallium, and zinc.

4. The semiconductor device according to claim 1, wherein the fifth transistor comprises an oxide semiconductor film.

5. The semiconductor device according to claim 4, wherein the oxide semiconductor film includes indium, gallium, and zinc.

6. The semiconductor device according to claim 1, wherein the semiconductor device is a programmable logic device.

7. The semiconductor device according to claim 1, wherein an electrical connection between the first logic block and the second logic block is determined in accordance with a potential of the fourth wiring.

8. A semiconductor device comprising:
  a first circuit comprising:
    a first transistor;
    a second transistor; and
    a third transistor,
    wherein the first to third transistors each comprise:
      a first terminal;
      a second terminal; and
      a gate electrode,
    wherein the gate electrode of the first transistor is electrically connected to a first wiring,
    wherein the first terminal of the first transistor is electrically connected to a second wiring,
    wherein the second terminal of the first transistor is electrically connected to the gate electrode of the second transistor,
    wherein the first terminal of the second transistor is electrically connected to the first terminal of the third transistor,
    wherein the second terminal of the second transistor and the gate electrode of the third transistor are electrically connected to a third wiring, and
    wherein the second terminal of the third transistor is electrically connected to a switch;
  a first logic block electrically connected to the switch; and
  a second logic block electrically connected to the switch.

9. The semiconductor device according to claim 8, wherein the second transistor comprises an oxide semiconductor film.

10. The semiconductor device according to claim 9, wherein the oxide semiconductor film includes indium, gallium, and zinc.

11. The semiconductor device according to claim 8, wherein the semiconductor device is a programmable logic device.

12. The semiconductor device according to claim 8, wherein an electrical connection between the first logic block and the second logic block is determined in accordance with a potential of the second terminal of the third transistor.

* * * * *